United States Patent
Siniaguine et al.

(12) 
(10) Patent No.: US 6,498,074 B2
(45) Date of Patent: *Dec. 24, 2002

(54) THINNING AND DICING OF SEMICONDUCTOR WAFERS USING DRY ETCH, AND OBTAINING SEMICONDUCTOR CHIPS WITH ROUNDED BOTTOM EDGES AND CORNERS

(75) Inventors: Oleg Siniaguine, San Carlos, CA (US); Patrick B. Halahan, San Mateo, CA (US); Sergey Savastiouk, San Jose, CA (US)

(73) Assignee: Tru-Si Technologies, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/876,888

(22) Filed: Jun. 6, 2001

(65) Prior Publication Data

US 2002/0013061 A1 Jan. 31, 2002

Related U.S. Application Data

(63) Continuation-in-part of application No. 09/752,802, filed on Dec. 28, 2000, which is a division of application No. 09/491,456, filed on Jan. 26, 2000, which is a continuation-in-part of application No. 09/083,927, filed on May 22, 1998, now Pat. No. 6,184,060, which is a continuation of application No. PCT/US97/18979, filed on Oct. 27, 1997.

(60) Provisional application No. 60/030,425, filed on Oct. 29, 1996.

(51) Int. Cl.⁷ .......................... H01L 21/46; H01L 21/78; H01L 21/301

(52) U.S. Cl. ...................... 438/460; 438/462; 438/465; 438/977

(58) Field of Search ................... 438/460, 462, 438/465, 977, 700

(56) References Cited

U.S. PATENT DOCUMENTS

| 3,739,463 A | 6/1973 | Aird et al. .................... 29/580 |
| 3,761,782 A | 9/1973 | Youmans ..................... 257/778 |
| 3,810,129 A | 5/1974 | Behman et al. ........ 340/173 DR |
| 3,811,117 A | 5/1974 | Anderson, Jr. et al. ..... 298/918 |
| 3,838,501 A | 10/1974 | Umbaugh ..................... 29/583 |

(List continued on next page.)

FOREIGN PATENT DOCUMENTS

| DE | 19707887 A1 | 9/1998 |
| EP | 0 807964 A1 | 4/1995 |
| EP | 0 698 288 | 2/1996 |
| EP | 0 757431 A2 | 7/1996 |
| WO | WO 92/03848 | 3/1992 |
| WO | WO 94/09513 | 4/1994 |
| WO | WO 94/25981 | 11/1994 |
| WO | WO 96/21943 | 7/1996 |
| WO | WO 97/45856 | 12/1997 |
| WO | WO 97/45862 | 12/1997 |

*Primary Examiner*—John F. Niebling
*Assistant Examiner*—Angel Roman
(74) *Attorney, Agent, or Firm*—Skjerven Morrill LLP; Michael Shenker

(57) ABSTRACT

A semiconductor wafer is diced before thinning. The wafer is diced only part of the way through, to form grooves which are at least as deep as the final thickness of each chip to be obtained from the wafer. Then the wafer backside is etched with a dry etch, for example, atmospheric pressure plasma etch. The wafer is thinned until the grooves are exposed from the backside. The dry etch leaves the chip's backside smooth. After the grooves have been exposed, the dry etch is continued to remove damage from the chip sidewalls and to round the chips' bottom edges and corners. The grooves' aspect ratio is large to reduce the lateral etch rate of the chip sidewalls and thus allow more area for on-chip circuitry.

17 Claims, 8 Drawing Sheets

U.S. PATENT DOCUMENTS

| | | | |
|---|---|---|---|
| 3,881,884 A | 5/1975 | Cook et al. | 29/590 |
| 3,991,296 A | 11/1976 | Kojima et al. | 219/121 L |
| 3,993,917 A | 11/1976 | Kalter | 307/235 F |
| 4,139,401 A | 2/1979 | McWilliams et al. | 148/175 |
| 4,141,135 A | 2/1979 | Henry et al. | 29/580 |
| 4,368,106 A | 1/1983 | Anthony | 204/15 |
| 4,394,712 A | 7/1983 | Anthony | 361/411 |
| 4,463,336 A | 7/1984 | Black et al. | 338/4 |
| 4,467,518 A | 8/1984 | Bansal et al. | 29/571 |
| 4,603,341 A | 7/1986 | Bertin et al. | 357/23.7 |
| 4,612,083 A | 9/1986 | Yasumoto et al. | 156/633 |
| 4,628,174 A | 12/1986 | Anthony | 219/76.13 |
| 4,722,130 A | 2/1988 | Kimura et al. | 29/413 |
| 4,729,971 A | 3/1988 | Coleman | 437/583 |
| 4,769,738 A | 9/1988 | Nakamura et al. | 361/283 |
| 4,807,021 A | 2/1989 | Okumura | 357/75 |
| 4,822,755 A | 4/1989 | Hawkins et al. | 437/227 |
| 4,842,699 A | 6/1989 | Hua et al. | 204/15 |
| 4,897,708 A | 1/1990 | Clements | 357/65 |
| 4,978,639 A | 12/1990 | Hua et al. | 437/230 |
| 4,996,587 A | 2/1991 | Hinrichsmeyer et al. | 357/74 |
| 5,024,970 A | 6/1991 | Mori | 437/226 |
| 5,160,987 A | 11/1992 | Pricer et al. | 257/307 |
| 5,191,405 A | 3/1993 | Tomita et al. | 257/777 |
| 5,229,647 A | 7/1993 | Gnadinger | 257/785 |
| 5,259,924 A | 11/1993 | Mathews et al. | 156/653 |
| 5,268,326 A | 12/1993 | Lesk et al. | 437/62 |
| 5,270,261 A | 12/1993 | Bertin et al. | 437/209 |
| 5,307,942 A | 5/1994 | Quelfeter et al. | 211/26 |
| 5,309,318 A | 5/1994 | Beilstein, Jr. et al. | 361/689 |
| 5,313,097 A | 5/1994 | Haj-Ali-Ahmadi et al. | 257/706 |
| 5,314,844 A | 5/1994 | Imamura | 437/226 |
| 5,414,637 A | 5/1995 | Bertin et al. | 364/489 |
| 5,426,566 A | 6/1995 | Beilstein, Jr. et al. | 361/735 |
| 5,466,634 A | 11/1995 | Beilstein, Jr. et al. | 437/180 |
| 5,467,305 A | 11/1995 | Bertin et al. | 365/185.01 |
| 5,468,663 A | 11/1995 | Bertin et al. | 437/43 |
| 5,478,781 A | 12/1995 | Bertin et al. | 437/209 |
| 5,502,333 A | 3/1996 | Bertin et al. | 257/685 |
| 5,502,667 A | 3/1996 | Bertin et al. | 365/51 |
| 5,506,753 A | 4/1996 | Bertin et al. | 361/705 |
| 5,517,057 A | 5/1996 | Beilstein, Jr. et al. | 257/686 |
| 5,517,754 A | 5/1996 | Beilstein, Jr. et al. | 29/840 |
| 5,532,519 A | 7/1996 | Bertin et al. | 257/777 |
| 5,561,622 A | 10/1996 | Bertin et al. | 365/51 |
| 5,563,086 A | 10/1996 | Bertin et al. | 437/52 |
| 5,567,653 A | 10/1996 | Bertin et al. | 437/173 |
| 5,567,654 A | 10/1996 | Beilstein, Jr. et al. | 437/209 |
| 5,571,754 A | 11/1996 | Bertin et al. | 437/209 |
| 5,596,226 A | 1/1997 | Beilstein, Jr. et al. | 257/690 |
| 5,646,067 A | 7/1997 | Gaul | 437/180 |
| 5,656,553 A | 8/1997 | Leas et al. | 438/15 |
| 5,691,248 A | 11/1997 | Cronin et al. | 437/227 |
| 5,707,485 A | 1/1998 | Rolfson et al. | 156/643.1 |
| 5,824,595 A | 10/1998 | Igel et al. | 438/464 |
| 5,843,844 A | 12/1998 | Miyanaga | 483/694 |
| 5,846,879 A | 12/1998 | Winnerl et al. | 430/666 |
| 5,851,845 A | 12/1998 | Wood et al. | 438/15 |
| 5,858,256 A * | 1/1999 | Minne et al. | 216/12 |
| 5,888,882 A | 3/1999 | Igel et al. | 438/460 |
| 5,888,883 A | 3/1999 | Sasaki et al. | 438/460 |
| 5,979,475 A | 11/1999 | Satoh et al. | 134/140 |
| 5,998,292 A | 12/1999 | Black et al. | 438/618 |
| 6,004,867 A | 12/1999 | Kim et al. | 438/459 |
| 6,036,872 A * | 3/2000 | Wood et al. | 216/2 |
| 6,083,811 A | 7/2000 | Riding et al. | 438/460 |
| 6,121,119 A | 9/2000 | Richards et al. | 438/462 |
| 6,162,701 A | 12/2000 | Usami et al. | 438/455 |
| 6,176,966 B1 | 1/2001 | Tsujimoto et al. | 156/344 |
| 6,184,060 B1 | 2/2001 | Siniaguine | 438/106 |
| 9,752,802 * | 5/2001 | Siniaguine et al. | 257/618 |

* cited by examiner

THINNING AND DICING OF SEMICONDUCTOR WAFERS USING DRY ETCH, AND OBTAINING SEMICONDUCTOR CHIPS WITH ROUNDED BOTTOM EDGES AND CORNERS

CROSS REFERENCE TO RELATED APPLICATIONS

The present application is a continuation in part of U.S. patent application Ser. No. 09/752,802, filed Dec. 28, 2000, which is a division of U.S. patent application Ser. No. 09/491,456, filed Jan. 26, 2000, which is a continuation in part of U.S. patent application Ser. No. 09/083,927 filed May 22, 1998, now U.S. Pat. No. 6,184,060, incorporated herein by reference, which is a continuation of PCT application PCT/US97/18979 (WO 98/19337), having an international filing date of Oct. 27, 1997, incorporated herein by reference, which claims priority of U.S. provisional application No. 60/030,425 filed Oct. 29, 1996, incorporated herein by reference.

BACKGROUND OF THE INVENTION

The present invention relates to thinning and dicing of semiconductor wafers using a dry etch.

In many semiconductor fabrication processes, when circuitry has been fabricated in a semiconductor wafer, the wafer is thinned and then diced into chips. The thinning is typically performed with mechanical lapping. Dicing is performed with a diamond saw or a laser. The diamond saw or the laser can be used to cut the wafer all the way through along scribe lines. Alternatively, the wafer is cut part of the way through, and then broken.

The thinning and dicing processes can damage the wafer. It is desirable to provide alternative processes that reduce wafer damage and prolong the lifetime of chips obtained from the wafer.

SUMMARY

Some embodiments of the present invention reduce or eliminate wafer damage and prolong the chip lifetime by dicing the wafer part of the way through and then thinning the wafer with a dry etch. The chip lifetime is prolonged because the dry etch removes damage from chip surfaces and rounds the chip's edges and corners.

More particularly, as illustrated in FIG. 1, a chip 110 obtained by prior art thinning and dicing techniques may have uneven, damaged surfaces 110B, 110S, with sharp bottom corners and edges. Surface 110B is the chip's backside, and surfaces 110S are sidewalls. The wafer has been thinned from backside 110B by mechanical lapping, and then diced along sidewalls 110S with a diamond saw or a laser apparatus. These thinning and dicing processes damage the backside 110B and sidewalls 110S. The damage may include chipped, jagged surfaces, and microcracks. When the chip 110 is later packaged and put into use, the chip is subjected to heating and cooling cycles. These cycles cause the chip's packaging material (not shown) to exert stresses on the chip. Additional stresses can be developed inside the chip due to the thermal cycles, chip handling, or the presence of different materials or other non-uniformities inside the chip. Because the chip surfaces 110B, 110S are damaged, and because they intersect at sharp edges and corners, the stresses concentrate at isolated points on the chip surface. Further, microcracks weaken the chip's resistance to stress. As a result, the chip becomes less reliable. Cracks formed or extended by stresses in the chip can reach and damage the chip circuitry (not shown).

Dry etch provides smoother chip surfaces and rounded edges and corners. Damage is reduced or eliminated. The chip reliability is therefore improved.

In some embodiments of the present invention, the wafer is processed as follows. The wafer is diced to form grooves in the face side of the wafer. The grooves are at least as deep as the final thickness of each chip to be obtained from the wafer. Dicing can be performed with a diamond saw or a laser. The grooves' sidewalls can be damaged.

Then the wafer backside is etched with the dry etch until the grooves are exposed from the backside. The dry etch leaves the chips' backside smooth. In some embodiments, the dry etch continues after the grooves have been exposed from the backside. The etchant gets into the grooves and smoothens the chip sidewalls, removing at least some of the sidewall damage. The etchant also rounds the bottom corners and edges of the chips.

Suitable etches include atmospheric pressure plasma etches described, for example, in the aforementioned U.S. Pat. No. 6,184,060. These etches are fairly fast. Silicon can be etched at 10 $\mu$m/min.

In some embodiments, the dry etch is a blanket uniform etch of the wafer's flat backside surface. No masking layers are used on the backside surface.

The invention is not limited to the embodiments described above. In some embodiments, one or more openings are formed in a first surface of a semiconductor wafer along a boundary of one or more chips. The openings do not go through the wafer. The wafer is thinned with a dry etch until the openings are exposed on a second side.

Other features of the invention are described below. The invention is defined by the appended claims.

DESCRIPTION OF SOME EMBODIMENTS

Figure 1:
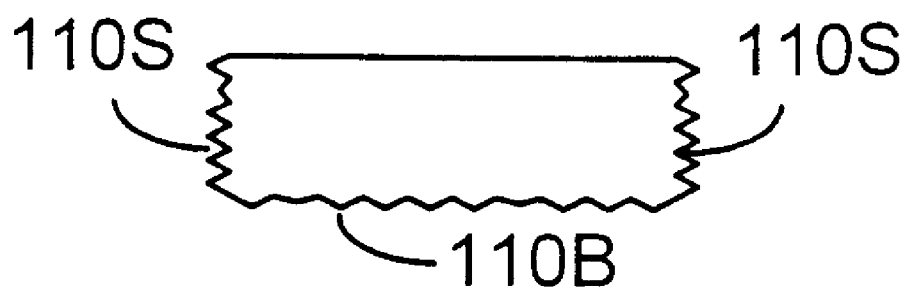
FIG. 1 is a side view of a prior art semiconductor chip.
Figure 2A:
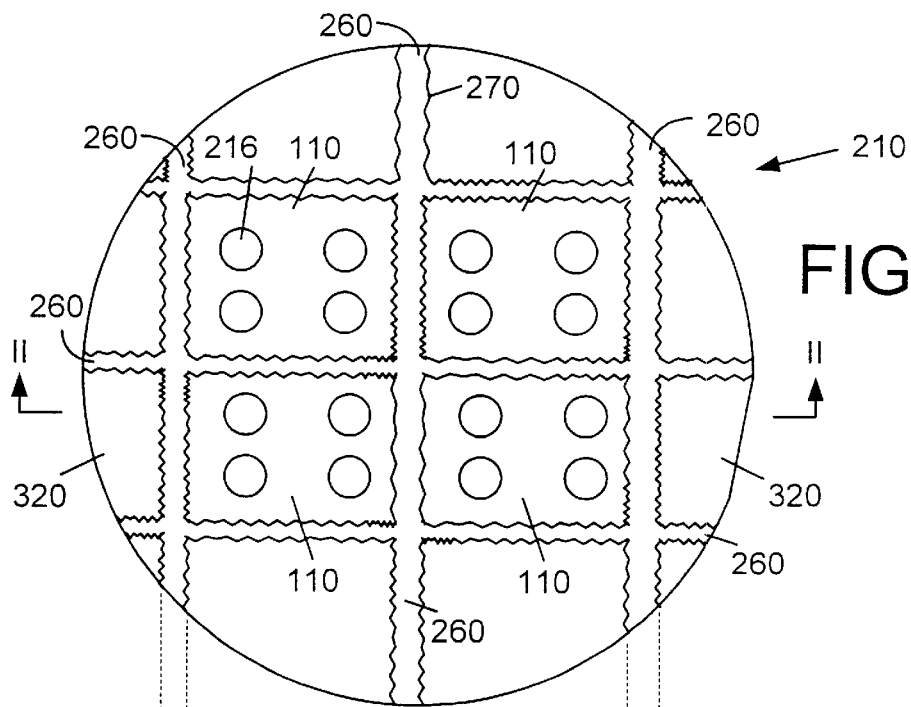
FIG. 2A is a top view of a wafer being processed according to an embodiment of the present invention.
Figure 2B:
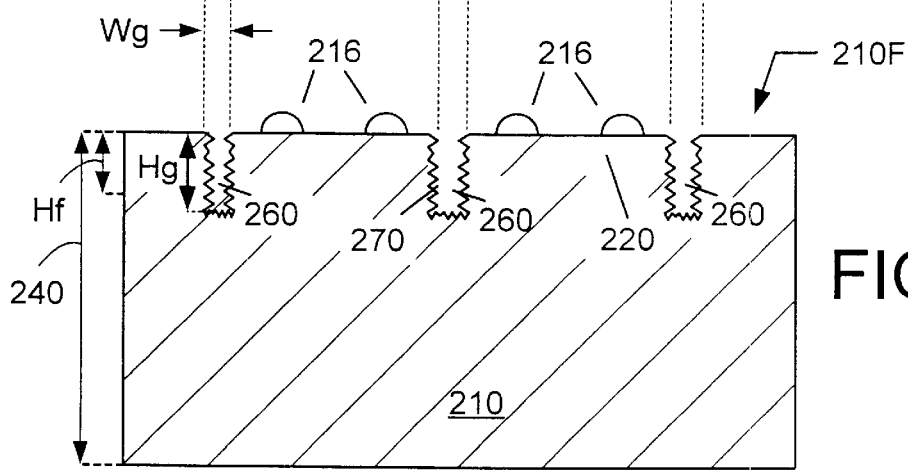
FIG. 2B shows a cross-section of the wafer of FIG. 2A along the lines II—II.

FIG. 2A is a top view of a semiconductor wafer 210 shown before the wafer is thinned with a dry etch. FIG. 2B is a cross sectional view of the wafer along the lines II—II in FIG. 2A. Circuitry has been fabricated in the wafer, and the wafer must now be divided into chips 110. The circuitry may include transistors, diodes, and other devices (not shown) manufactured in and over an active layer 220 (FIG. 2B) adjacent to the wafer top surface 210F (the surface shown in FIG. 2A). Optional conductive bumps 216 have been manufactured on contact pads on top surface 210F of chips 110. The bumps will be used to connect the chips to wiring substrates (not shown), e.g., printed circuit boards.

The wafer thickness 240 has been sufficiently large to achieve suitable mechanical strength and heat dissipation during fabrication of the wafer circuitry. 720 µm is suitable for some silicon wafer fabrication processes. The wafer will now to be thinned to its final thickness Hf. In some embodiments, the final thickness is 10–450 µm. These thickness figures are illustrative and not limiting.

After the circuitry and the bumps 216 were manufactured, grooves 260 were formed in the wafer top surface along scribe lines and, in particular, along the boundary of chips 110. The grooves could be formed by conventional dicing techniques, e.g. with a diamond saw or a laser. Other processes, e.g., a masked etch, could also be used. The grooves do not go through the wafer. The grooves are at least as deep as the final chip thickness Hf. In some embodiments, the groove depth is 10–450 µm. The grooves will be exposed from the bottom during wafer thinning when the wafer back side 110B is etched, as described below.

The groove sidewall and bottom surfaces 270 can be damaged by dicing, as schematically shown by uneven lines in FIGS. 2A, 2B.

Figure 3:
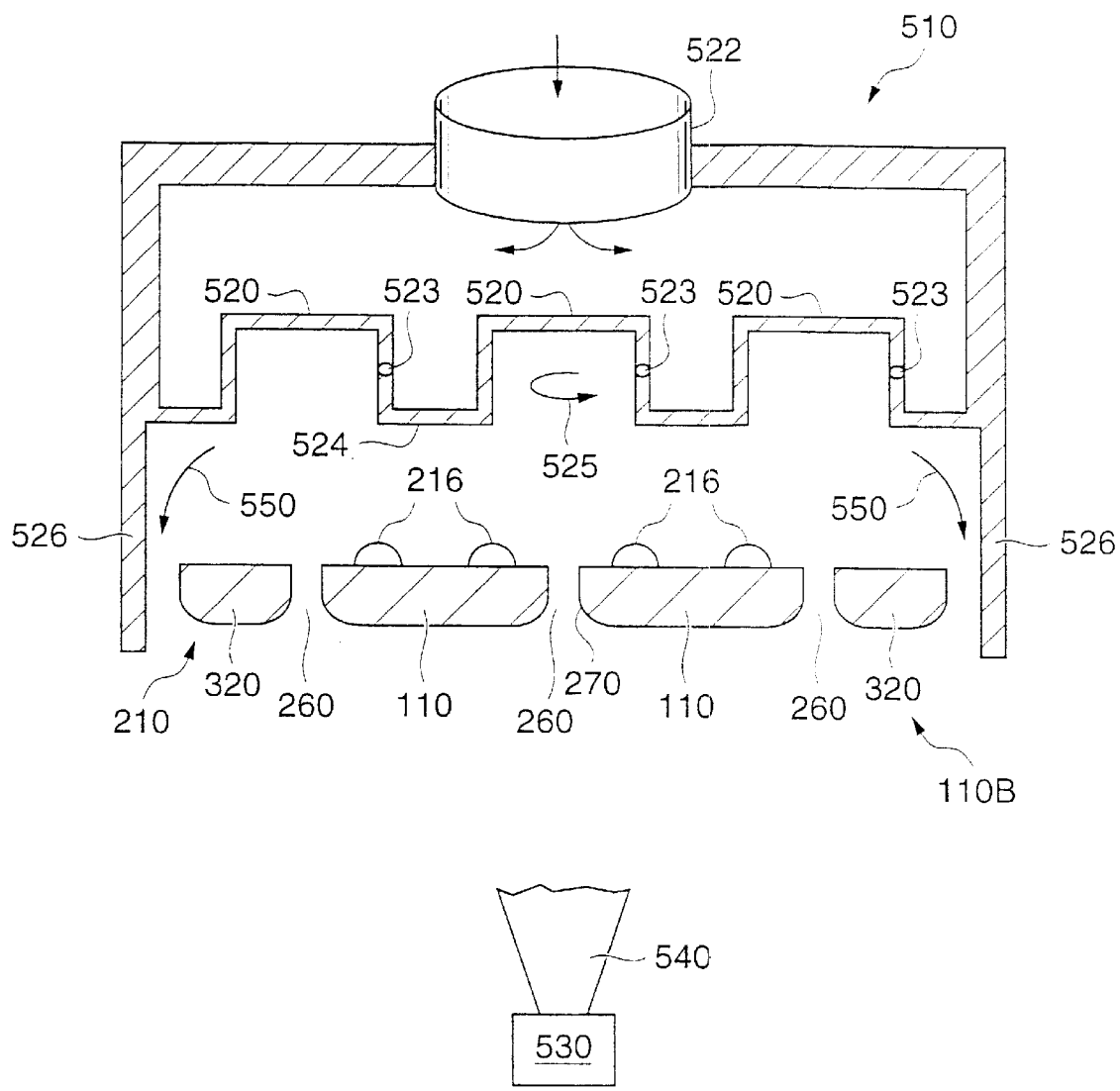
FIGS. 3 and 4 are cross-sections illustration of a wafer and processing equipment during wafer thinning according to an embodiment of the present invention.

Wafer 210 is placed in a non-contact wafer holder 510 (FIG. 3). Holder 510 includes one or more vortex chucks 520 having outlets in the holder's surface 524. Surface 524 faces the top surface of the wafer. Gas supplied under pressure through a conduit 522 enter chucks 520 through respective passages 523. Each passage is tangential to the chuck's cylindrical chamber when viewed from the top. A gas vortex 525 emitted by each chuck towards the wafer generates a low pressure zone near the chuck's vertical axis. In this zone, the wafer is drawn towards the chuck. At the same time, the gas vortices do not allow the wafer to touch the holder surface 524. Such wafer holders are described, for example, in U.S. patent application Ser. No. 09/456,135 "Non-Contact Workpiece Holder" filed by O. Siniaguine et al. on Dec. 7, 1999 and incorporated herein by reference. Other suitable holders are described in PCT publication WO 99/46805 (TruSi Technologies, LLC, Sep. 16, 1999) incorporated herein by reference. Other holders, for example, Bernoulli type holders, electrostatic holders, mechanical clamps, or vacuum chucks, can also be used.

Wafer holder 510 is called "non-contact" because the top surface of the wafer does not contact the holder surface 524. However, the edge of the wafer can contact the holder's limitors 526 which extend around the wafer to restrict the wafer lateral motion. In some embodiments, holder 510 is mounted on a rotating carousel (not shown). The carousel rotation develops a centrifugal force that presses the wafer against one or more limitors 526. See PCT publication WO 99/26796 (TruSi Technologies, LLC, Jun. 3, 1999).

The wafer backside surface 110B is etched with a dry etch. In FIG. 3, the etch is a blanket (unmasked) uniform etch of the wafer's flat semiconductor backside surface (e.g., silicon surface). The etch is atmospheric pressure plasma etch. Plasma generator 530 generates plasma 540 into which suitable reagents are injected. If the wafer is made of silicon, a CF4 etch can be used. See PCT publication WO 98/19337 (TruSi Technologies, LLC, May 7, 1998) incorporated herein by reference. A suitable etcher is type Tru-Etch 3000 (trademark) available from TruSi Technologies, LLC, of Sunnyvale, Calif. The dry etch thins the wafer until the grooves 260 are exposed from the bottom. When the grooves are exposed, the plasma enters the grooves and etches the groove sidewalls 270. The sidewalls become smoother as a result. The dicing damage becomes partially or completely removed from the sidewalls. The bottom corners and edges of chips 110 become rounded.

Advantageously, some atmospheric pressure plasma etching processes described in WO 98/19337 are fast. Silicon can be etched at the rate of about 10 µm/min. Other kinds of etches can also be used. The dry etch can be preceded by mechanical lapping of the wafer bottom surface 110B.

In some embodiments, before the backside etch, the groove depth Hg (FIG. 2B) exceeds the final chip thickness by an amount needed to obtain the rounded edges and corners and smooth sidewalls for chips 110. The more the groove depth exceeds the final chip thickness, the longer the duration of the backside etch after the grooves have been exposed from the bottom. The bottom corners and edges become more rounded, and more time is allowed for sidewall damage removal. In some embodiments, the radius of the rounded corners is roughly 1.5 times the thickness of the material removed from the wafer backside after the grooves are exposed. The depth of the grooves also takes into account possible wafer non-uniformity, the non-uniformity of the dicing process that creates the grooves, and the non-uniformity of the backside etch. If mechanical lapping or any other process is used to remove material from the wafer backside before the dry etch illustrated in FIG. 5, the non-uniformity of such processes can also be taken into account. In some embodiments, the groove depth Hg exceeds the final chip thickness Hf by 10 µm or more.

Figure 4:
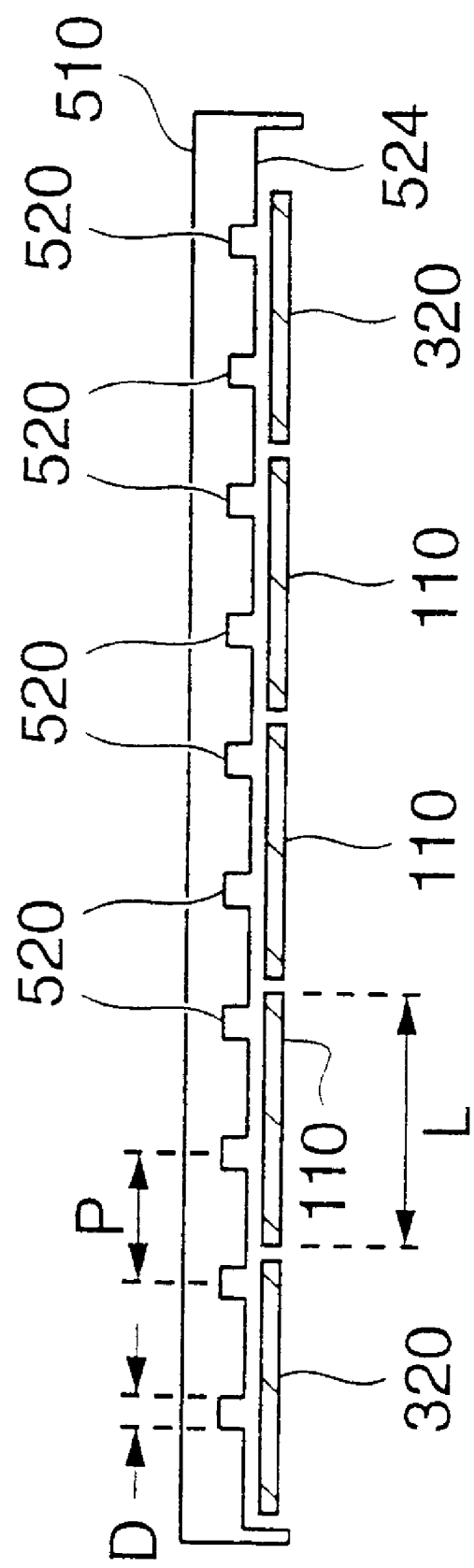

When the grooves 260 become exposed during the thinning etch of FIG. 3, chips 110 become separated from each other, but the chips are held in holder 510 by the vacuum forces developed by the gas vortices. The vortex chucks 520 are positioned close to each other to insure that each chip 110 will be adjacent to a low pressure zone developed by at least one chuck 520. In FIG. 4, "L" denotes the greatest lateral dimension of each chip 110. "P" is the distance between the centers of the adjacent chucks 520. "D" is the diameter of each chuck. "P" and "D" can vary for different chucks 520 in the same wafer holder. The diameter D of each vortex chuck should be small enough to prevent a chip from being sucked into the chuck. The chip should be balanced at a predetermined distance from the wafer holder surface 524 by the vacuum forces drawing the chip towards the holder and the opposite-direction forces generated between the chucks by the gas flowing away from the chucks. In some embodiments, D<L/2 and P<L/2 for all the chucks.

In some embodiments, each of P and D is less than one half of the shortest side of each rectangular chip 110.

In some embodiments, the distance between the adjacent chucks and the diameter of each chuck take into account the peripheral wafer portions 320 (FIG. 2A). Each of P and D is less than one half of the greatest lateral dimension, or of the longest or shortest side, of each portion 320.

Figure 5:
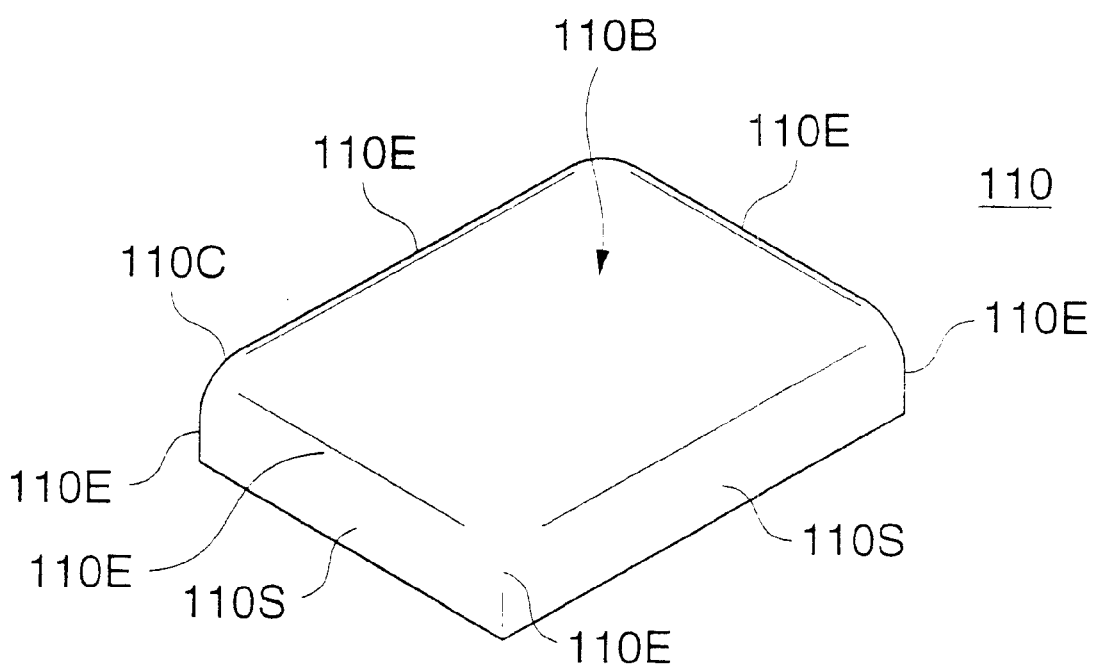
FIG. 5 is a perspective view of a chip processed according to an embodiment of the present invention.

FIG. 5 is a perspective view of a chip 110 after the etch. The chip is shown bottom side up. The chip's sidewalls 110S and bottom surface 110B are smooth. The edges 110E at which the sidewalls 110S meet with each other and with the bottom surface 110B are rounded, and so are the bottom corners 110C. The smooth surfaces and the rounded edges and corners prolong the chip's lifetime and improve the chip's reliability.

Figure 6:
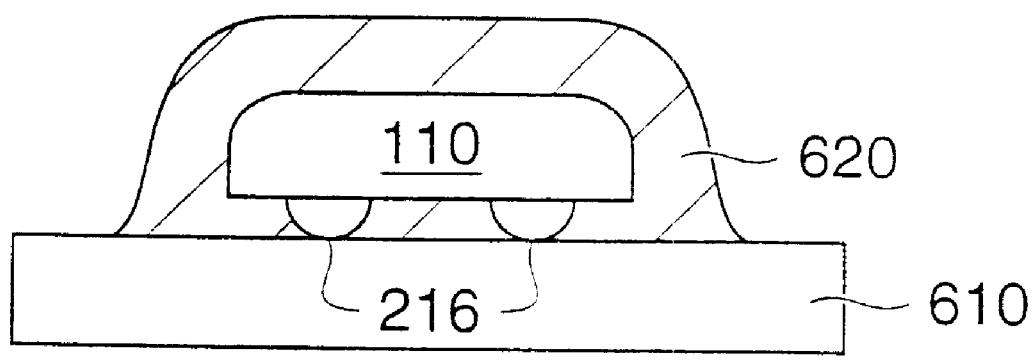
FIG. 6 is a side view of a packaged chip processed according to an embodiment of the present invention.

In FIG. 6, chip 110 has been mounted on a printed circuit board 610 using flip chip technology. Bumps 216 are soldered to the printed circuit board. Encapsulant 620 (suitable plastic) is deposited over the chip for protective purposes. The chip's smooth surfaces and rounded edges and corners prolong the chip's lifetime. Similar advantages are achieved with non-flip-chip packaging.

Figure 7:
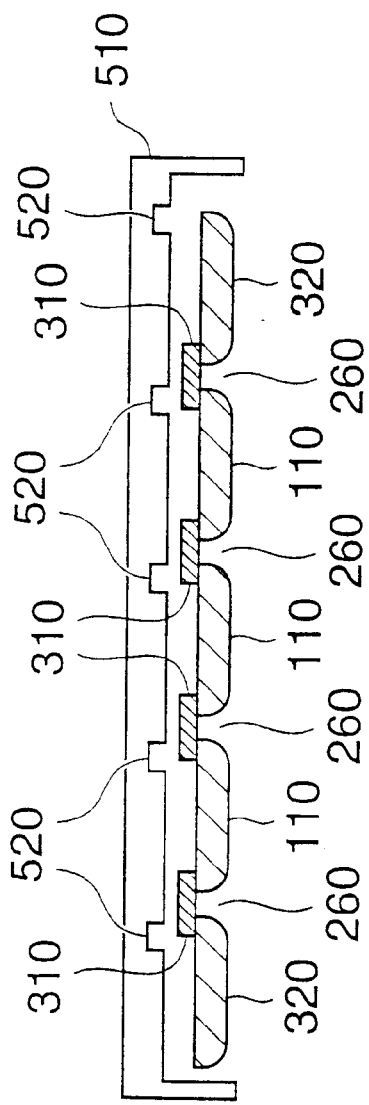
FIGS. 7 through 11 are cross-section illustrations of wafers being processed according to embodiments of the present invention.

In FIG. 7, the etch uniformity is improved by depositing a layer 310 over grooves 260 and wafer portions adjacent to the grooves. Layer 310 is deposited before the backside etch of the wafer. When chips 110 and peripheral portions 320 become separated during the backside etch, the layer 310 holds the chips and the portions 320 in the same position relative to each other. Therefore, the gaps between the chips 110 and the peripheral portions 320 remain uniform, and hence the chip sidewalls (the sidewalls of grooves 260) are etched uniformly. If some chips 110 were too close to each other or to peripheral portions 320, the chips' sidewalls could be etched too slowly, and less damage would be removed than desirable. Other sidewalls, farther from adjacent chips 110 or portions 320, could be undesirably overetched.

Layer 310 also relaxes the requirements for the distance between adjacent vortex chucks 520 and the diameter of each chuck since the chips 110 and peripheral portions 320 are held in position by layer 310 throughout the backside etch.

Layer 310 can be a sticky material which adheres to the wafer without additional adhesive. Alternatively, adhesives can be used. In some embodiments, layer 310 is polyimide. Polyimide is chosen because it does not react with etchants utilized in some thinning processes (e.g., CF4). The thickness of polyimide layer 310 is 1 $\mu$m to 200 $\mu$m in some embodiments. Other materials and thicknesses can also be used. In some embodiments, layer 310 is an adhesive tape such as described in U.S. Pat. No. 5,888,883 issued on Mar. 30, 1999 to Sasaki et al.

Layer 310 does not cover the middle portions of chips 110, including the bumps 216. The bumps, and any other uneven features of the chip top surface 210F, are believed to be capable of impeding adhesion of layer 310 to the wafer.

In some embodiments, layer 310 is pre-manufactured as a continuous sheet. Then openings are cut out in layer 310 at the location of the middle portions of chips 110. Then layer 310 is deposited.

Layer 310 can be deposited using known techniques. In some embodiments, layer 310 is deposited at atmospheric pressure using a roller to remove air bubbles. Alternatively, layer 310 can be laminated on the wafer in vacuum, with or without a roller.

Figure 8:
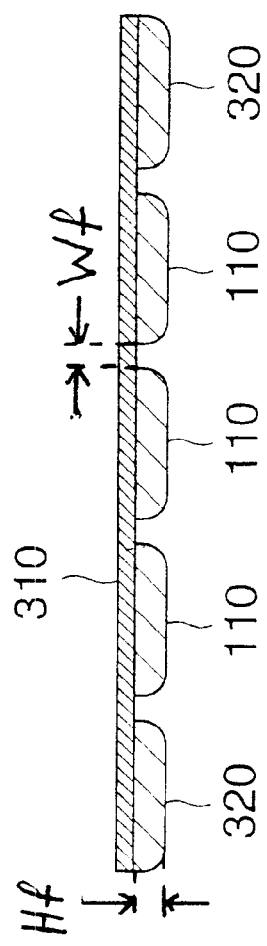

In some embodiments, layer 310 covers peripheral portions 320. In FIG. 8, layer 310 covers the entire wafer. In some embodiments, the top surface of chips 110 is even, bumps 216 are absent.

The invention is not limited to layer 310 covering or exposing any particular features of the wafer.

Layer 310 prevents the plasma from going through the grooves 260 and damaging the circuitry at the top surface of the wafer. Gas emitted by chucks 520 flows down around the wafer as shown at 550 in FIG. 3, and impedes the plasma from flowing up around the wafer and reaching the wafer top surface. As indicated in the aforementioned U.S. patent application Ser. No. 09/456,135, the chuck density can be made high at the edge of wafer holder 510 to prevent the plasma from flowing up around the wafer. Gas can be made to flow down at all points around the wafer.

Figure 9:
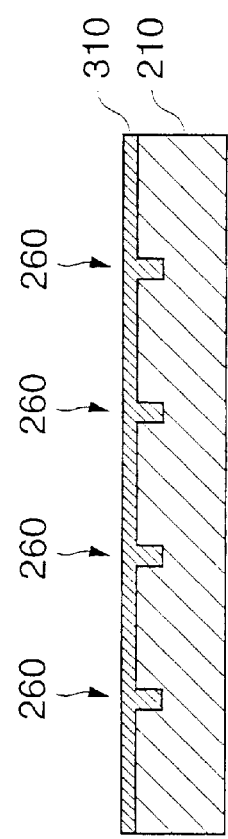

In FIG. 9, layer 310 has been deposited by a spin-on or spraying technique. Layer 310 fills grooves 260. (In contrast, in FIGS. 7 and 8, the grooves are not filled.) Layer 310 in FIG. 9 can be polymer or some other material.

Figure 10:
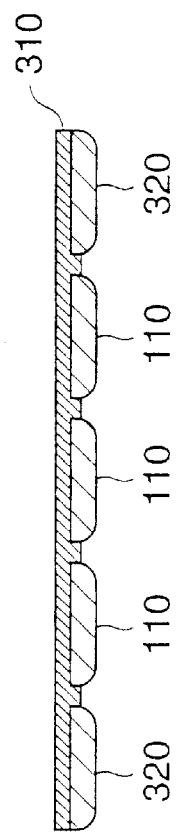

FIG. 10 shows the structure after the backside etch for FIG. 9. In the embodiment of FIG. 10, when layer 310 is exposed from the bottom, layer 310 is etched faster than the wafer substrate. Therefore, the bottom surface of layer 310 is higher than the bottom surface of chips 110 and peripheral portions 320. The bottom corners and edges of chips 110 have been exposed to the etchant, and have been rounded.

Figure 11:
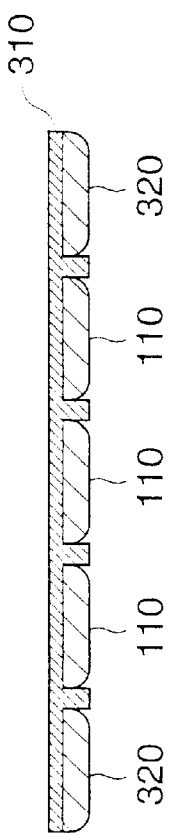

FIG. 11 illustrates an embodiment in which the layer 310 is etched slower than the wafer substrate. This is the case if layer 310 is polyimide, the wafer is a silicon wafer, and the etch is a CF4 plasma etch. Layer 310 is etched slowly, but the microloading effect causes the chips 110 to be etched faster at the bottom edges adjacent to layer 310. As a result, the bottom edges and corners of chips 110 are rounded.

After the etch of FIG. 10 or 11, layer 310 is removed. In some embodiments, polyimide layer 310 is removed by oxygen plasma.

In some embodiments, when the wafer is etched from the bottom and the grooves 260 are exposed, it is desirable to reduce the horizontal etch rate of the grooves' sidewalls 270. Excessive etching of the sidewalls reduces the area available for the on-chip circuitry. In some embodiments, the lateral (horizontal) etch rate is reduced by controlling the grooves' aspect ratio A1=Hg/Wg, where Wg is the width of groove 260.

When A1 is high, the sidewall etch rate is reduced while the vertical etch rate at the bottom of the wafer remains the same. A high vertical etch rate is desirable because it reduces the dicing time and also reduces the time needed to remove jagged edges protruding from the grooves' sidewalls. In some embodiments in which Wg is measured at the top of the wafer, the aspect ratio A1 is chosen to be at least 0.5, or at least 1, or at least 1.2, or at least 2, or at least 3, or at least 4, or at least 5, or at least some other number.

In an exemplary embodiment, the wafer is diced with a saw, and the groove width Wg is 25 to 30 $\mu$m (depending on the saw). In another embodiment, the wafer is diced with a laser apparatus, and the groove width Wg is about 100 $\mu$m. In still another embodiment, the wafer is diced with a dry etch (for example, RIE), and the groove width is 5 $\mu$m. The groove width Wg is measured at the top of the wafer. (If the wafer is diced with a dry etch, the groove sidewalls are not necessarily vertical, and the groove width may vary with depth.) The wafer is diced while being attached to tape 310 (FIGS. 7, 8). In these exemplary embodiments, the final wafer thickness Hf is 100 $\mu$m, and the groove depth Hg is slightly higher, for example, 110 $\mu$m. These values are exemplary and not limiting. Other values are used in other embodiments. For example, Hg can be 30 $\mu$m or some other value.

In some embodiments, a lower bound is placed on the parameter A2=Hf/Wf where Wf is the final distance between the chips 110 (FIG. 8). Wf can be measured at the top of the chips. A2 represents the aspect ratio at the end of the backside etch. Lower bounds can also be placed on parameters A3=Hg/Wf, A4=Hf/Wg. Appropriate bound values for A2, A3, A4 include 0.5, 1, 1.2, 2, 3, 4, 5, or other values.

The invention is not limited by any particular mathematical formula for defining a lower bound for A1, A2, A3, or A4. For example, defining a lower bound for Hf/Wf has the same effect as defining an upper bound for Wf/Hf. Also, Hg$\geq$Hf, so if Hg/Wg$\geq$LB (some lower bound), then Hf/Wg$\geq$LB. Other mathematical dependencies can also be explored to define a limitation on the horizontal etch rate of the grooves' sidewalls.

The invention is not limited to isotropic backside etches. In some embodiments, an anisotropic etch is used, e.g., vacuum plasma RIE (reactive ion etching). The etchant's ions are reflected from tape 310 which is made, for example, from an organic compound resistant to the echant. These reflected ions hit the grooves' sidewalls, so the sidewalls are etched horizontally. A high aspect ratio of the grooves retards horizontal etching.

In some embodiments, each of the parameters Hg, Wg, Hf, Wf has the same value throughout the wafer, but the invention is not limited to such embodiments. For example, different grooves may have different widths Wg in the same wafer.

In some embodiments, the grooves between adjacent chips 110 have the same depth and width as the grooves separating the chips 110 from the peripheral portions 320, but this is not necessary.

The above embodiments illustrate but do not limit the invention. The invention is not limited to silicon wafers or any packaging technology. The invention is not limited to plasma etching, or to any particular etch chemistry or type of etcher. In some embodiments, the lateral etch rate at the groove sidewalls is reduced by a suitable choice of etching parameters. For example, in a vacuum plasma etch, the wafer can be held at a suitable potential to steer ions vertically towards the wafer and not laterally. Such potential may be tens or hundreds of volts, for example. The invention is not limited to wafers containing multiple chips. In some embodiments, only one chip has been fabricated in the wafer. The chip is extracted and the wafer peripheral portions 320 are discarded. The invention is not limited to unmasked or uniform backside etches. Other embodiments and variations are within the scope of the invention, as defined by the appended claims.

What is claimed is:

1. A method for obtaining one or more chips from a semiconductor wafer, the method comprising:

forming an opening in a first surface of the semiconductor wafer on a boundary of the one or more chips, the first surface being on a first side of the semiconductor wafer, wherein the opening does not go through the wafer; and thinning the wafer with a dry etch to remove material from an entire second side of the wafer at least until the opening becomes exposed on the second side, wherein the dry etch rounds one or more of the edges and/or corners obtained on the second side of the wafer at a location of the opening when the opening becomes exposed.

2. The method of claim 1 wherein at least a portion of the opening is elongated and for at least said portion, a ratio $H1/W1 \geq 0.5$, wherein H1 is a depth of the opening at said portion, the depth being measured before the opening is exposed on the second side, and W1 is a width of the opening at said portion, the width being measured at the first surface.

3. The method of claim 2 wherein W1 is at most 100 μm.

4. The method of claim 2 wherein W1 is at most 30 μm.

5. The method of claim 2 wherein W1 is at most 5 μm.

6. The method of claim 2 wherein the opening extends along an entire boundary of at least one chip.

7. The method of claim 1 wherein at least a portion of the opening is elongated, and for at least said portion, a ratio $H2/W1 \geq 0.5$, wherein H2 is a final thickness of the wafer and W1 is a width of the opening at said portion, the width being measured at the first surface.

8. The method of claim 7 wherein W1 is at most 100 μm.

9. The method of claim 7 wherein W1 is at most 30 μm.

10. The method of claim 7 wherein W1 is at most 5 μm.

11. The method of claim 7 wherein the opening extends along an entire boundary of at least one chip.

12. The method of claim 1 wherein at least a portion of the opening is elongated, and for at least said portion, a ratio $H1/W2 \geq 0.5$, wherein H1 is a depth of the opening at said portion, the depth being measured before the opening is exposed on the second side, and W2 is a minimal distance between a chip obtained from the wafer and an adjacent portion of the wafer at an end of the dry etch.

13. The method of claim 12 wherein the opening extends along an entire boundary of at least one chip.

14. The method of claim 1 wherein a ratio $H2/W2 \geq 0.5$, wherein H2 is a final thickness of the wafer and W2 is a minimal distance between a chip obtained from the wafer and an adjacent portion of the wafer at an end of the dry etch.

15. The method of claim 14 wherein the opening extends along an entire boundary of at least one chip.

16. The method of claim 1 wherein the semiconductor wafer comprises circuitry made at the first side of the wafer, the second side is a backside opposite to the first side, and the opening runs along a scribe line on the first side.

17. The method of claim 15 wherein the opening extends along an entire boundary of at least one chip.

* * * * *